(12) United States Patent
Wang

(10) Patent No.: US 12,309,994 B2
(45) Date of Patent: May 20, 2025

(54) METHOD OF MANUFACTURING MEMORY DEVICE HAVING DOUBLE SIDED CAPACITOR

(71) Applicant: NANYA TECHNOLOGY CORPORATION, New Taipei (TW)

(72) Inventor: Wen-Chieh Wang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 678 days.

(21) Appl. No.: 17/695,245

(22) Filed: Mar. 15, 2022

(65) Prior Publication Data

US 2023/0200042 A1  Jun. 22, 2023

Related U.S. Application Data

(60) Provisional application No. 63/291,547, filed on Dec. 20, 2021.

(51) Int. Cl.
*H10D 1/68* (2025.01)
*H10B 12/00* (2023.01)

(52) U.S. Cl.
CPC .................. *H10B 12/03* (2023.02)

(58) Field of Classification Search
None
See application file for complete search history.

(56) References Cited

U.S. PATENT DOCUMENTS

| 9,240,441 B2 * | 1/2016 | Yoon | H01L 28/40 |
| 11,444,086 B2 * | 9/2022 | Dai | H01L 23/642 |
| 2021/0074706 A1 | 3/2021 | Dai | |

FOREIGN PATENT DOCUMENTS

| CN | 108550569 A | 9/2018 |
| KR | 20210144128 A | 11/2021 |
| TW | I397168 B | 5/2013 |
| TW | I549168 B | 9/2016 |

\* cited by examiner

*Primary Examiner* — Antonio B Crite
*Assistant Examiner* — Nkechinyere Esiaba
(74) *Attorney, Agent, or Firm* — Muncy, Geissler, Olds & Lowe, P.C.

(57) ABSTRACT

The present application provides a method of manufacturing a memory device. The method includes steps of providing a semiconductor substrate; disposing a first supporting layer over the semiconductor substrate; disposing a first molding layer over the first supporting layer; disposing a second supporting layer over the first molding layer; removing a portion of the second supporting layer to form a first opening; disposing a second molding layer over the second supporting layer and within the first opening; forming a trench extending through the first supporting layer, the first molding layer, the second supporting layer and the second molding layer; disposing a conductive layer conformal to the trench; and removing the first molding layer and the second molding layer.

18 Claims, 21 Drawing Sheets

METHOD OF MANUFACTURING MEMORY DEVICE HAVING DOUBLE SIDED CAPACITOR

PRIORITY CLAIM AND CROSS-REFERENCE

This application claims the priority benefit of U.S. provisional application Ser. No. 63/291,547, filed on Dec. 20, 2021. The entirety of the above-mentioned patent application is hereby incorporated by reference herein and made a part of this specification.

TECHNICAL FIELD

The present disclosure relates to a method of manufacturing a memory device, and more particularly, to a method of manufacturing a memory device having a capacitor with an improved parasitic capacitance and a strengthened overall structure.

DISCUSSION OF THE BACKGROUND

Dynamic random-access memory (DRAM) is a type of semiconductor arrangement for storing bits of data in separate capacitors within an integrated circuit (IC). DRAM is commonly formed as capacitor DRAM cells. A DRAM memory circuit is manufactured by replicating DRAM cells on a single semiconductor wafer. Each DRAM cell can store a bit of data. The DRAM cell consists of a storage capacitor and an access transistor. One widely used type of capacitor is known as a container capacitor, which is in a cylindrical shape and has a circular cross section. The container capacitor can be double-sided, where both sides of a bottom electrode are surrounded by a top electrode connecting to a reference voltage in a periphery region of the DRAM memory circuit.

Over the past few decades, as semiconductor fabrication technology has continuously improved, sizes of DRAM memory circuits have been correspondingly reduced. As a size of the DRAM cell is reduced to a few nanometers in length, strength of a structure of the DRAM cell is a concern. Collapse or wobbling may happen during manufacturing. It is therefore desirable to develop improvements that address related manufacturing challenges.

SUMMARY

One aspect of the present disclosure provides a memory device. The memory device includes a semiconductor substrate; a capacitor protruding from the semiconductor substrate; a first supporting layer disposed on the semiconductor substrate and surrounding the capacitor; and a second supporting layer disposed above the first supporting layer and surrounding the capacitor, wherein the second supporting layer includes a first opening extending through the second supporting layer and disposed adjacent to the capacitor.

In some embodiments, the first supporting layer and the second supporting layer are separated from each other.

In some embodiments, the capacitor includes a conductive layer electrically connected to the semiconductor substrate.

In some embodiments, the conductive layer includes a first portion disposed on the semiconductor substrate and surrounded by the first supporting layer, and a second portion protruding from and coupled to the first portion and surrounded by the second supporting layer.

In some embodiments, the conductive layer is an electrode of the capacitor.

In some embodiments, the conductive layer includes titanium nitride (TiN) or titanium silicon nitride (TiSiN).

In some embodiments, the first supporting layer and the second supporting layer include lattice nitride.

In some embodiments, the first supporting layer is at least partially exposed through the first opening.

In some embodiments, the memory device further comprises a third supporting layer disposed above the second supporting layer and surrounding the capacitor.

In some embodiments, the third supporting layer includes lattice nitride.

In some embodiments, the third supporting layer includes a second opening extending through the third supporting layer.

In some embodiments, the second opening is disposed above the first opening.

Another aspect of the present disclosure provides a method of manufacturing a memory device. The method includes steps of providing a semiconductor substrate; disposing a first supporting layer over the semiconductor substrate; disposing a first molding layer over the first supporting layer; disposing a second supporting layer over the first molding layer; removing a portion of the second supporting layer to form a first opening; disposing a second molding layer over the second supporting layer and within the first opening; forming a trench extending through the first supporting layer, the first molding layer, the second supporting layer and the second molding layer; disposing a conductive layer conformal to the trench; and removing the first molding layer and the second molding layer.

In some embodiments, the first molding layer is at least partially in contact with the second molding layer through the first opening.

In some embodiments, the first opening extends between the first molding layer and the second molding layer.

In some embodiments, the first opening is formed prior to the removal of the first molding layer.

In some embodiments, the first molding layer and the second molding layer are removed by a wet etching process.

In some embodiments, the first opening is formed prior to the disposing of the second molding layer.

In some embodiments, the first molding layer and the second molding layer include oxide.

In some embodiments, the portion of the second supporting layer is removed by a dry etching process.

In some embodiments, the first opening is formed prior to the disposing of the conductive layer.

In some embodiments, a portion of the conductive layer is removed during the removal of the first molding layer and the second molding layer.

In some embodiments, the conductive layer is at least partially disposed on the semiconductor substrate.

In some embodiments, the removal of the first molding layer is performed immediately after the removal of the second molding layer.

In some embodiments, the first molding layer is at least partially exposed through the second supporting layer after the first opening is formed.

In some embodiments, the first supporting layer and the second supporting layer surround the conductive layer after the removal of the first molding layer and the second molding layer.

Another aspect of the present disclosure provides a method of manufacturing a memory device. The method includes steps of providing a semiconductor substrate; disposing a first supporting layer over the semiconductor substrate; disposing a first molding layer over the first supporting layer; disposing a second supporting layer over the first molding layer; forming a first opening through the second supporting layer to at least partially expose the first molding layer; disposing a second molding layer over the second supporting layer and within the first opening; disposing a third supporting layer over the second molding layer; forming a trench extending through the first supporting layer, the first molding layer, the second supporting layer, the second molding layer and the third supporting layer; disposing a conductive layer conformal to the trench; removing a portion of the third supporting layer to form a second opening and at least partially expose the second molding layer; and removing the first molding layer and the second molding layer.

In some embodiments, the first opening is formed prior to the removal of the portion of the third supporting layer.

In some embodiments, the removal of the first molding layer and the second molding layer is performed immediately after the removal of the portion of the third supporting layer.

In some embodiments, the portion of the third supporting layer is removed by a dry etching process.

In some embodiments, a portion of the conductive layer is removed during the removal of the portion of the third supporting layer.

In some embodiments, the first opening is formed prior to the disposing of the third supporting layer.

In some embodiments, the first supporting layer, the second supporting layer and the third supporting layer include a same material.

In some embodiments, the first opening is formed prior to the formation of the trench.

In some embodiments, the conductive layer is surrounded by the first supporting layer, the second supporting layer and the third supporting layer.

In conclusion, because an opening is formed in an intermediate supporting layer prior to a disposing of a molding layer over the intermediate supporting layer, a subsequent etching of the molding layer can be performed at one time. As such, unintentional reduction of a conductive layer of a capacitor during the etching of the molding layer can be prevented or minimized. Therefore, a strength of an overall structure of the capacitor can be enhanced. An overall performance of a memory device and process of manufacturing the memory device are improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
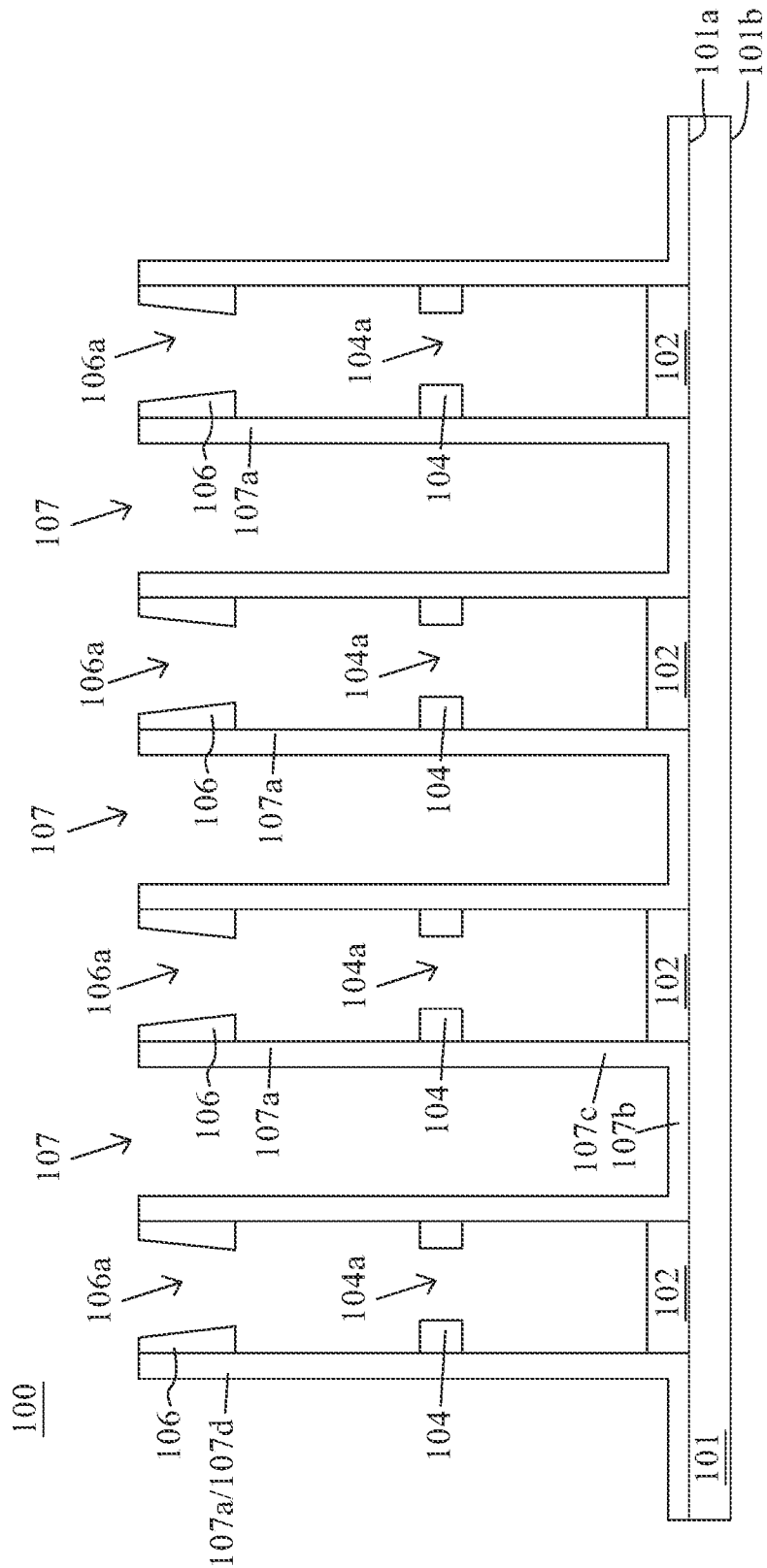
FIG. 1 is a cross-sectional side view of a first memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
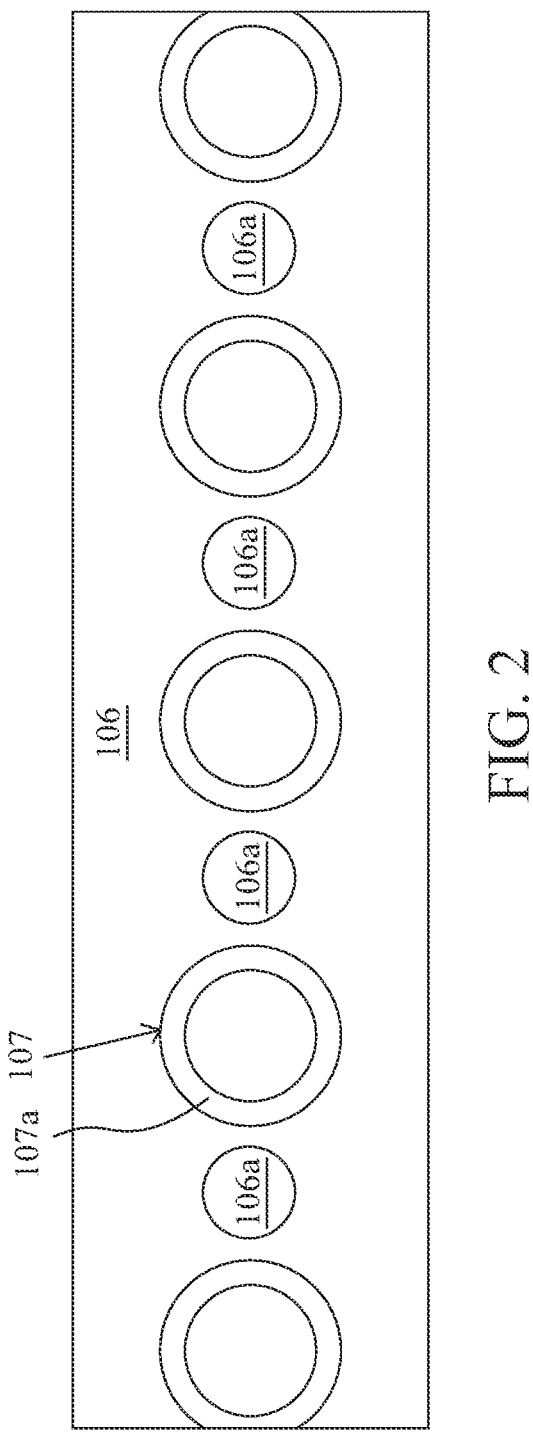
FIG. 2 is a top view of the first memory device of FIG. 1 in accordance with other embodiments of the present disclosure.

FIG. 1 is a schematic cross-sectional side view of a first memory device 100 in accordance with some embodiments of the present disclosure. Further, FIG. 2 is a schematic top view of the first memory device 100 of FIG. 1. In some embodiments, the first memory device 100 includes several unit capacitor cells arranged in rows and columns.

In some embodiments, the first memory device 100 includes a semiconductor substrate 101. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate. In some embodiments, the semiconductor substrate 101 includes lightly-doped monocrystalline silicon. In some embodiments, the semiconductor substrate 101 is a p-type substrate.

In some embodiments, the semiconductor substrate 101 includes several active areas (AA), which are doped regions in the semiconductor substrate 101. In some embodiments, the active area extends horizontally over or under a top surface of the semiconductor substrate 101. In some embodiments, each of the active areas includes a same type of dopant. In some embodiments, each of the active areas includes a type of dopant that is different from types of dopants included in other active areas. In some embodiments, each of the active areas has a same conductive type.

In some embodiments, the semiconductor substrate 101 includes a top surface 101a and a bottom surface 101b opposite to the top surface 101a. In some embodiments, the top surface 101a is a front side of the semiconductor substrate 101, wherein electrical devices or components are subsequently formed over the top surface 101a and configured to electrically connect to an external circuitry. In some embodiments, the bottom surface 101b is a back side of the semiconductor substrate 101, where electrical devices or components are absent.

In some embodiments, a landing pad is disposed over the top surface 101a of the semiconductor substrate 101. The landing pad is configured to electrically connect to an external conductive member. In some embodiments, the landing pad includes conductive material such as copper (Cu), tungsten (W) or the like.

In some embodiments, the first memory device 100 includes a capacitor 107 protruding from the semiconductor substrate 101. In some embodiments, the capacitor 107 is a container capacitor and has a circular, oval or polygonal cross-sectional shape. In some embodiments, the capacitor 107 has a circular cross-section as shown in FIG. 2. In some embodiments, the capacitor 107 is a double-sided capacitor in which a bottom electrode is surrounded by two pieces of a top electrode. In some embodiments, the capacitor 107 is disposed on and electrically connected to the landing pad of the semiconductor substrate 101.

In some embodiments, the capacitor 107 includes a conductive layer 107a electrically connected to the semiconductor substrate 101. In some embodiments, the conductive layer 107a is an electrode 107d of the capacitor 107 or is a part of the electrode 107d of the capacitor 107. In some embodiments, the conductive layer 107a is a bottom electrode of the capacitor 107. In some embodiments, the electrode 107d of the capacitor 107 is electrically connected to the landing pad. In some embodiments, the conductive layer 107a includes conductive material such as titanium nitride (TiN) or titanium silicon nitride (TiSiN).

In some embodiments, the conductive layer 107a includes a first portion 107b disposed on the semiconductor substrate 101 and a second portion 107c protruding from and coupled to the first portion 107b. In some embodiments, the first portion 107b is in contact with the top surface 101a of the semiconductor substrate 101. In some embodiments, the second portion 107c extends away from the semiconductor substrate 101 and stands upright. In some embodiments, the first portion 107b is substantially orthogonal to the second portion 107c. In some embodiments, the first portion 107b and the second portion 107c have a same thickness.

In some embodiments, the first memory device 100 includes a first supporting layer 102 disposed on the semiconductor substrate 101 and surrounding the capacitor 107. In some embodiments, the first portion 107b of the conductive layer 107a is surrounded by the first supporting layer 102. In some embodiments, the first supporting layer 102 surrounds a part of the second portion 107c of the conductive layer 107a. In some embodiments, the first supporting layer 102 is an etch stop layer. In some embodiments, the first supporting layer 102 includes nitride, lattice nitride, silicon nitride or the like.

In some embodiments, the first memory device 100 includes a second supporting layer 104 disposed above the first supporting layer 102 and surrounding the capacitor 107. In some embodiments, the second portion 107c of the conductive layer 107a of the capacitor 107 is surrounded by the second supporting layer 104. In some embodiments, the first supporting layer 102 and the second supporting layer 104 are separated from each other. In some embodiments, a thickness of the second supporting layer 104 is substantially equal to a thickness of the first supporting layer 102. In some embodiments, the second supporting layer 104 is an etch stop layer. In some embodiments, the second supporting layer 104 and the first supporting layer 102 include a same material. In some embodiments, the second supporting layer 104 includes nitride, lattice nitride, silicon nitride or the like.

In some embodiments, the second supporting layer 104 includes a first opening 104a extending through the second supporting layer 104 and disposed adjacent to the capacitor 107. In some embodiments, the first supporting layer 102 is at least partially exposed through the first opening 104a. The first opening 104a is disposed above the first supporting layer 102. In some embodiments, the first opening 104a is surrounded by the second portion 107c of the conductive layer 107a of the capacitor 107. In some embodiments, the first opening 104a is configured to allow an etchant to flow therethrough. In some embodiments, the first opening 104a is tapered toward the first supporting layer 102.

In some embodiments, the first memory device 100 includes a third supporting layer 106 disposed above the second supporting layer 104. In some embodiments, the third supporting layer 106 surrounds the capacitor 107. In some embodiments, the third supporting layer 106 surrounds the second portion 107c of the conductive layer 107a of the capacitor 107. In some embodiments, a top surface of the third supporting layer 106 is substantially coplanar with a top surface of the conductive layer 107a. In some embodiments, a thickness of the third supporting layer 106 is substantially greater than the thickness of the second supporting layer 104. In some embodiments, the thickness of the third supporting layer 106 is substantially greater than the thickness of the first supporting layer 102.

In some embodiments, the second supporting layer 104 is disposed between the first supporting layer 102 and the third supporting layer 106. In some embodiments, the third supporting layer 106 is separated from the first supporting layer 102 and the second supporting layer 104. In some embodiments, the third supporting layer 106 is an etch stop layer. In some embodiments, the third supporting layer 106 includes a same material as the first supporting layer 102 and the second supporting layer 104. In some embodiments, the third supporting layer 106 includes nitride, lattice nitride, silicon nitride or the like.

In some embodiments, the third supporting layer 106 includes a second opening 106a extending through the third supporting layer 106 and disposed adjacent to the capacitor 107. In some embodiments, the first supporting layer 102 is at least partially exposed through the second opening 106a. In some embodiments, the second supporting layer 104 is at least partially exposed through the second opening 106a. In some embodiments, the second opening 106a is disposed above the first opening 104a. In some embodiments, the second opening 106a is disposed above the first supporting layer 102.

In some embodiments, the second opening 106a is surrounded by the second portion 107c of the conductive layer 107a of the capacitor 107. In some embodiments, the second opening 106a is configured to allow an etchant to flow therethrough. In some embodiments, a width of the first opening 104a is substantially smaller than a width of the second opening 106a. In some embodiments, the second opening 106a is tapered toward the second supporting layer 104 and the first supporting layer 102.

Because the second supporting layer 104 has the first opening 104a configured to allow the etchant to flow therethrough, unintentional reduction of the conductive layer 107a of the capacitor 107 during manufacturing of the first memory device 100 can be prevented or minimized. Therefore, a strength of an overall structure of the capacitor 107 can be enhanced. An overall performance of the first memory device 100 can be improved.

Figure 3:
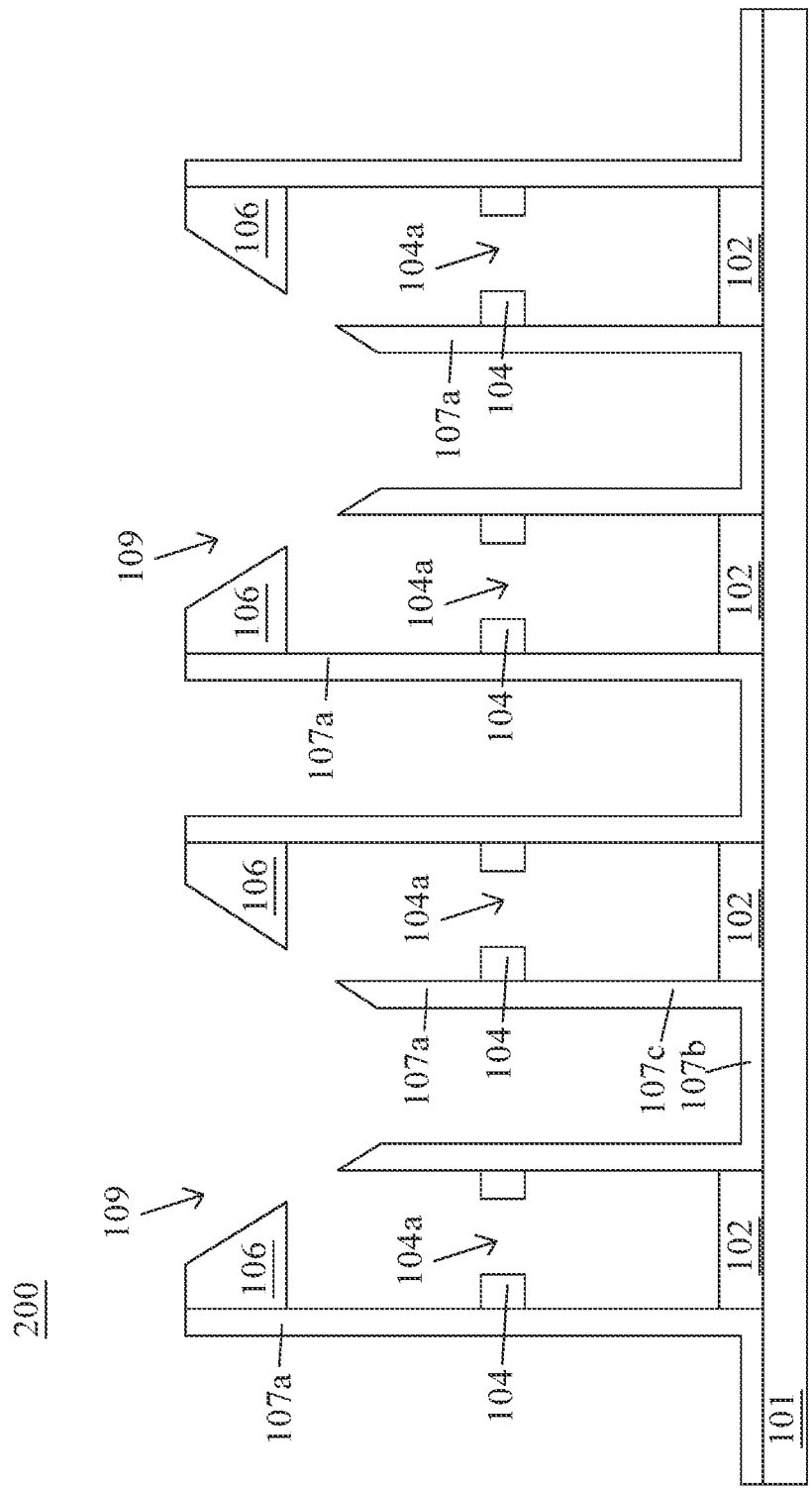
FIG. 3 is a cross-sectional side view of a second memory device in accordance with other embodiments of the present disclosure.
Figure 4:
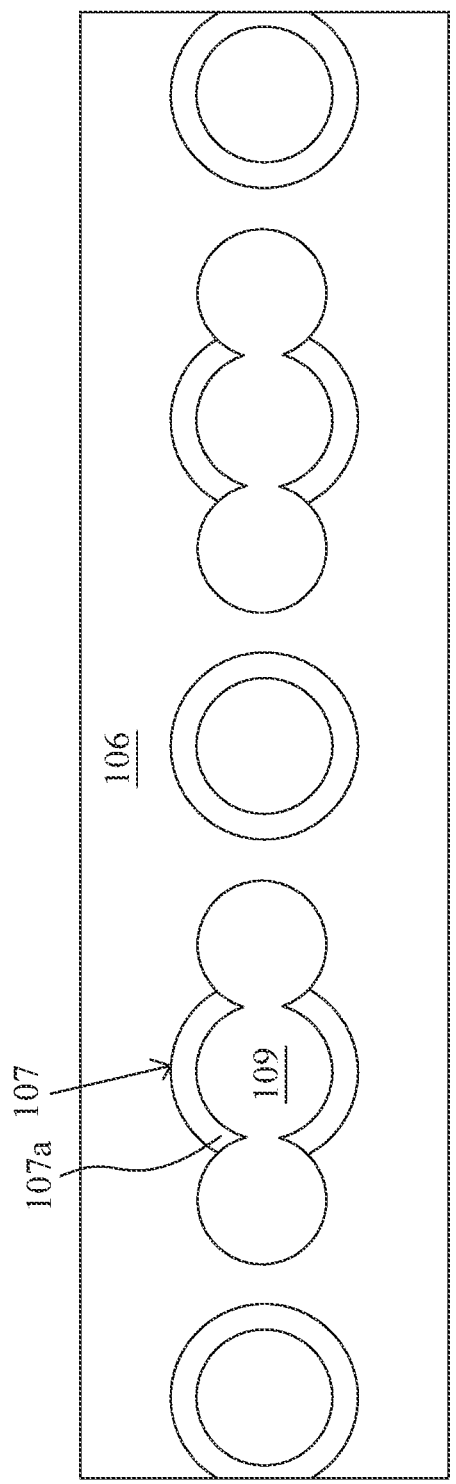
FIG. 4 is a top view of the second memory device of FIG. 3 in accordance with other embodiments of the present disclosure.

FIG. 3 is a schematic cross-sectional side view of a second memory device 200 in accordance with some embodiments of the present disclosure. Further, FIG. 4 is a schematic top view of the second memory device 200 of FIG. 3. The second memory device 200 is similar to the first memory device 100 of FIG. 1, except some portions of the conductive layer 107a are further removed to enlarge the second opening 106a compared to the first memory device 100 of FIG. 1, thus forming a third opening 109 as shown in FIG. 3.

In some embodiments, the third opening 109 is disposed above the capacitor 107. In some embodiments, the third opening 109 is tapered toward the capacitor 107. In some embodiments, a width of the third opening 109 is substantially greater than the width of the second opening 106a of the first memory device 100. In some embodiments, the top surface of the second portion 107c of the conductive layer 107 is at a level lower than the top surface of the third supporting layer 106. In some embodiments, a height of the capacitor 107 in the second memory device 200 is substantially less than a height of the capacitor 107 in the first memory device 100.

Figure 5:
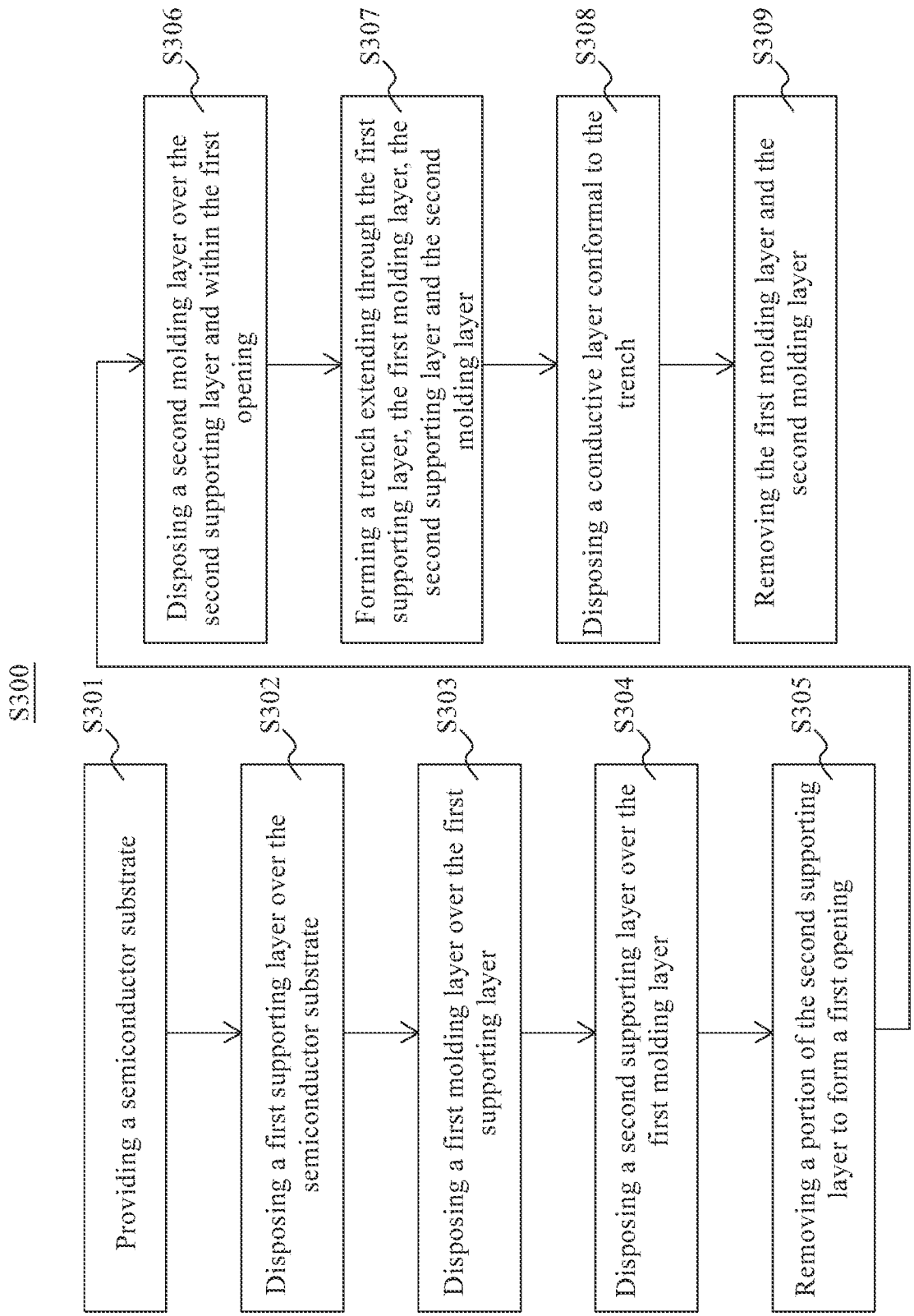
FIG. 5 is a flow diagram illustrating a method of manufacturing a memory device in accordance with some embodiments of the present disclosure.

FIG. 5 is a flow diagram illustrating a method S300 of manufacturing the first memory device 100 or the second memory device 200 in accordance with some embodiments of the present disclosure, and FIGS. 6 to 23 illustrate cross-sectional views of intermediate stages in formation of the first memory device 100 or the second memory device 200 in accordance with some embodiments of the present disclosure.

The stages shown in FIGS. 6 to 23 are also illustrated schematically in the flow diagram in FIG. 5. In following discussion, the fabrication stages shown in FIGS. 6 to 23 are discussed in reference to process steps shown in FIG. 5. The method S300 includes a number of operations, and description and illustration are not deemed as a limitation to a sequence of the operations. The method S300 includes a number of steps (S301, S302, S303, S304, S305, S306, S307, S308 and S309).

Figure 6:
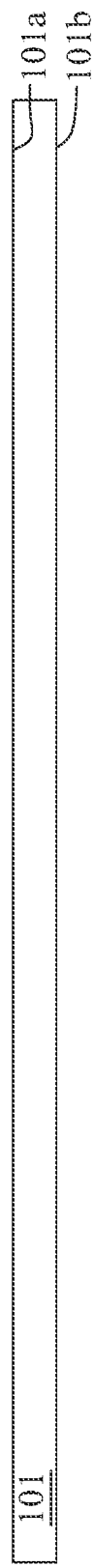
FIGS. 6 to 23 illustrate cross-sectional views of intermediate stages in the formation of a memory device in accordance with some embodiments of the present disclosure.

Referring to FIG. 6, a semiconductor substrate 101 is provided according to step S301 in FIG. 5. In some embodiments, the semiconductor substrate 101 includes semiconductive material such as silicon, germanium, gallium, arsenic, or a combination thereof. In some embodiments, the semiconductor substrate 101 includes a top surface 101a and a bottom surface 101b opposite to the top surface 101a. In some embodiments, the top surface 101a is a front side of the semiconductor substrate 101, wherein electrical devices or components are subsequently formed over the top surface 101a and configured to electrically connect to an external circuitry. In some embodiments, the bottom surface 101b is a back side of the semiconductor substrate 101, where electrical devices or components are absent.

In some embodiments, a landing pad is disposed over the top surface 101a of the semiconductor substrate 101. The landing pad is configured to electrically connect to an external conductive member. In some embodiments, the landing pad includes conductive material such as copper (Cu), tungsten (W) or the like.

Figure 7:

Referring to FIG. 7, a first supporting layer 102 is disposed over the semiconductor substrate 101 according to step S302 in FIG. 5. In some embodiments, the first supporting layer 102 is disposed by deposition, atomic layer deposition (ALD) or any other suitable process. In some embodiments, the first supporting layer 102 is disposed on the top surface 101a of the semiconductor substrate 101 to entirely cover the semiconductor substrate 101. In some embodiments, the first supporting layer 102 includes nitride, lattice nitride, silicon nitride or the like.

Figure 8:
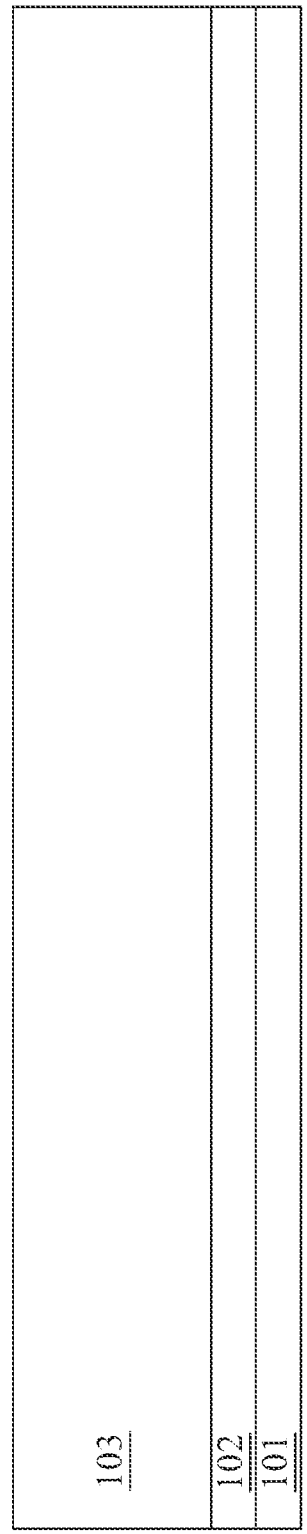

Referring to FIG. 8, a first molding layer 103 is disposed over the first supporting layer 102 according to step S303 in FIG. 5. In some embodiments, the first molding layer 103 is disposed by film coating, chemical vapor deposition (CVD) or any other suitable process. In some embodiments, the first molding layer 103 entirely covers the first supporting layer 102. In some embodiments, the first molding layer 103 includes dielectric material such as oxide, doped oxide film, borophosphosilicate glass (BPSG) or the like.

Figure 9:
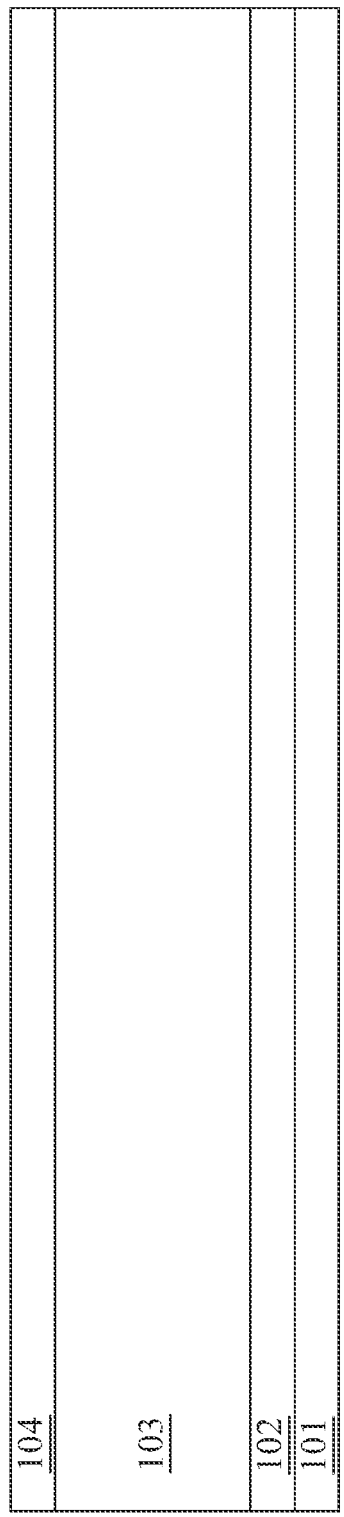

Referring to FIG. 9, a second supporting layer 104 is disposed over the first molding layer 103 according to step S304 in FIG. 5. In some embodiments, the second supporting layer 104 is disposed by deposition, atomic layer deposition (ALD) or any other suitable process. In some embodiments, the second supporting layer 104 entirely covers the first molding layer 103. In some embodiments, the second supporting layer 104 includes nitride, lattice nitride, silicon nitride or the like. In some embodiments, the first supporting layer 102 and the second supporting layer 104 include a same material.

Figure 10:
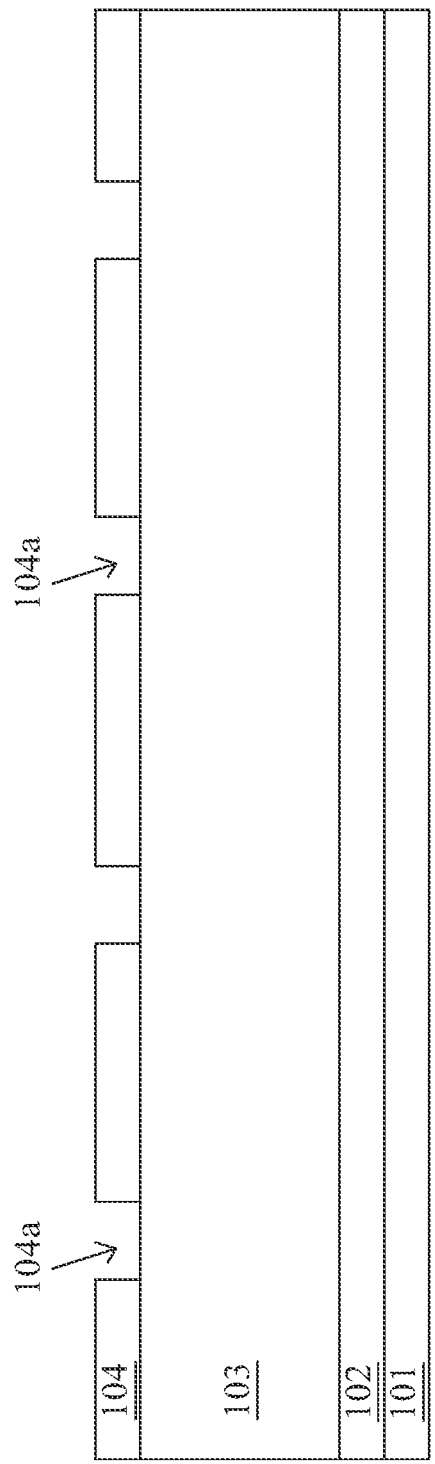
Figure 11:

Referring to FIGS. 10 and 11, a portion of the second supporting layer 104 is removed to form a first opening 104a according to step S305 in FIG. 5. FIG. 11 is a top view of FIG. 10. In some embodiments, the portion of the second supporting layer 104 is removed by etching, dry etching or any other suitable process. In some embodiments, the first opening 104a extends through the second supporting layer 104.

In some embodiments, the first molding layer 103 is at least partially exposed through the first opening 104a. In some embodiments, the first molding layer 103 is at least partially exposed through the second supporting layer 104 after the first opening 104a is formed. In some embodiments, the first opening 104a is configured to allow an etchant to flow therethrough. In some embodiments, the first opening 104a is tapered toward the first molding layer 103.

Figure 12:
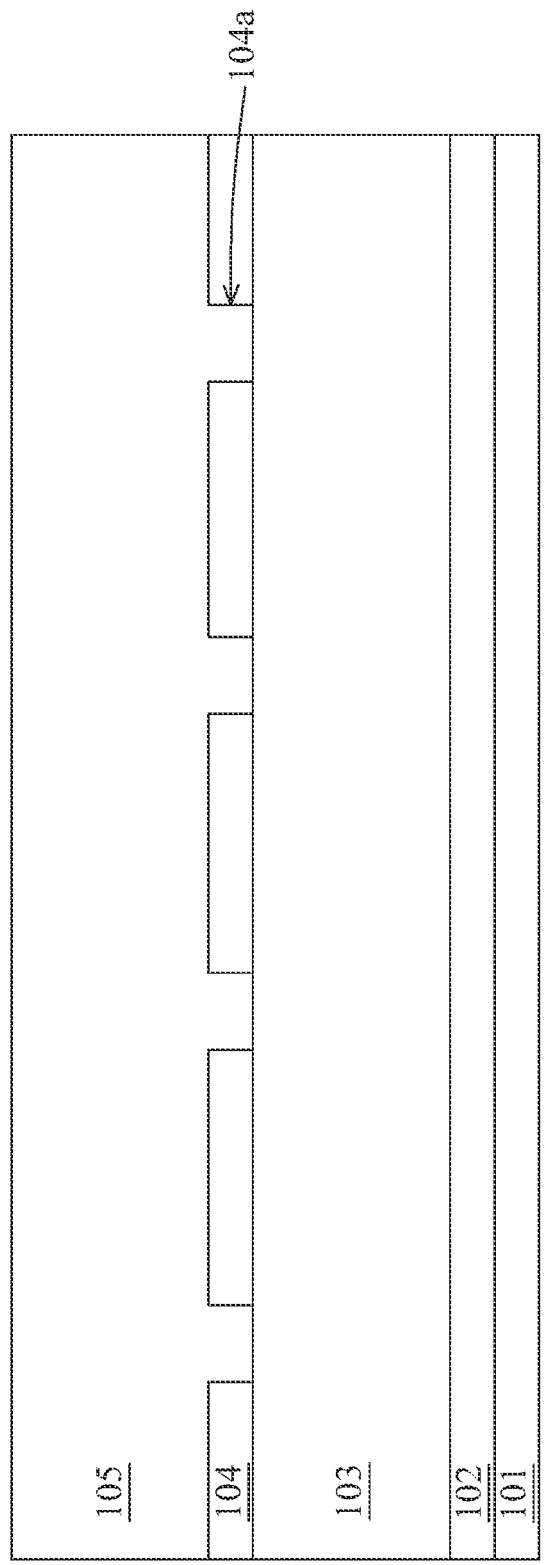

Referring to FIG. 12, a second molding layer 105 is disposed over the second supporting layer 104 and within the first opening 104a according to step S306 in FIG. 5. In some embodiments, the first molding layer 103 is at least partially in contact with the second molding layer 105 through the first opening 104a. In some embodiments, the first opening 104a extends between the first molding layer 103 and the second molding layer 105. In some embodiments, the first opening 104a is formed prior to the disposing of the second molding layer 105.

In some embodiments, the second molding layer 105 is disposed by film coating, chemical vapor deposition (CVD) or any other suitable process. In some embodiments, the second molding layer 105 includes dielectric material such as oxide, doped oxide film, borophosphosilicate glass (BPSG) or the like. In some embodiments, the first molding layer 103 and the second molding layer 105 include a same material.

Figure 13:
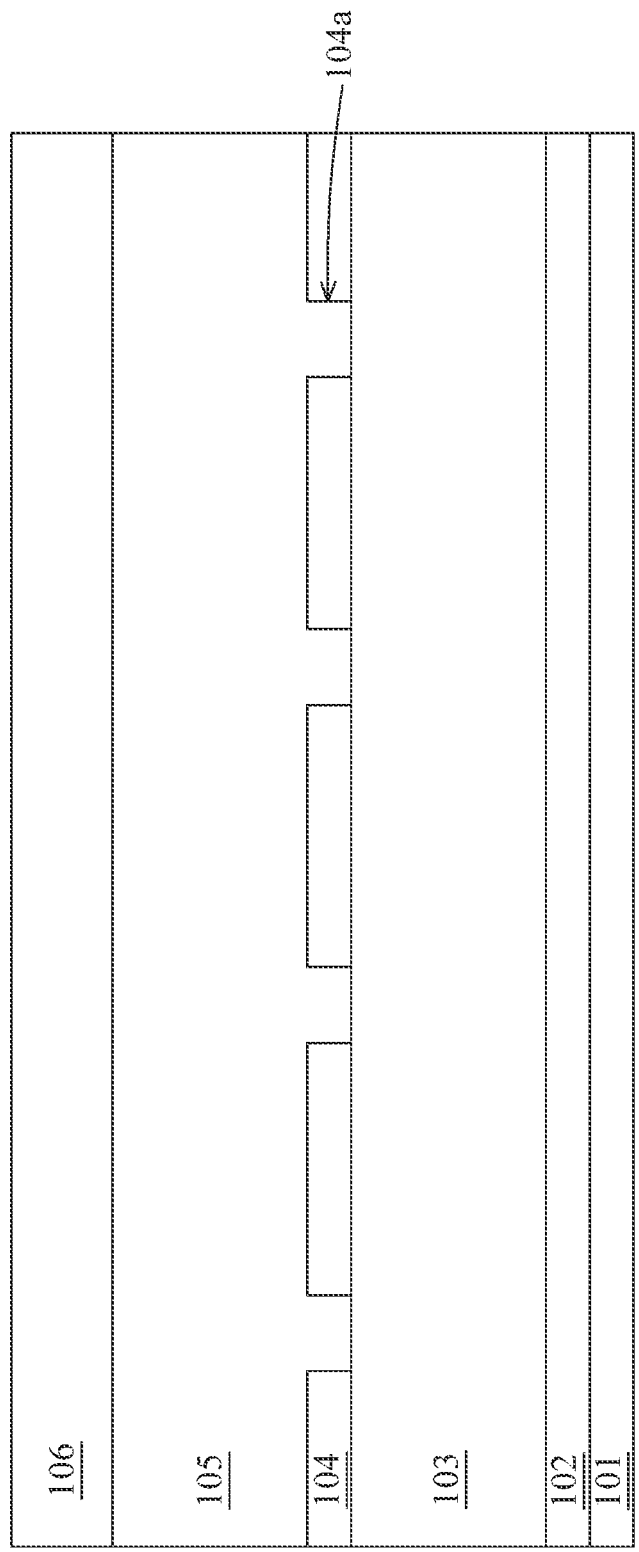

In some embodiments, after the disposing of the second molding layer 105, a third supporting layer 106 is disposed over the second molding layer 105 as shown in FIG. 13. In some embodiments, the first opening 104a is formed prior to the disposing of the third supporting layer 106. In some embodiments, the third supporting layer 106 is disposed by deposition, atomic layer deposition (ALD) or any other suitable process. In some embodiments, the third supporting layer 106 entirely covers the second molding layer 105. In some embodiments, the third supporting layer 106 includes nitride, lattice nitride, silicon nitride or the like. In some embodiments, the first supporting layer 102, the second supporting layer 104 and the third supporting layer 106 include a same material.

Figure 14:
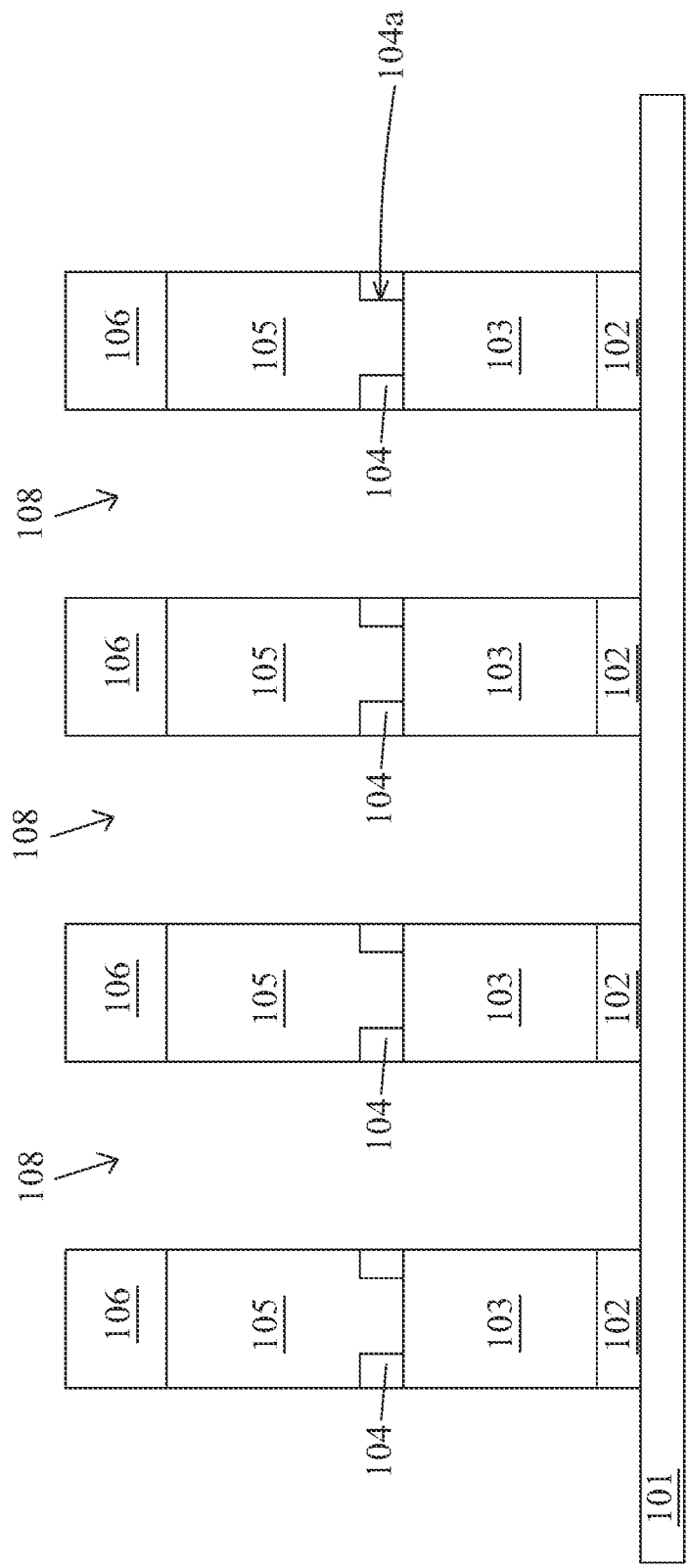
Figure 15:
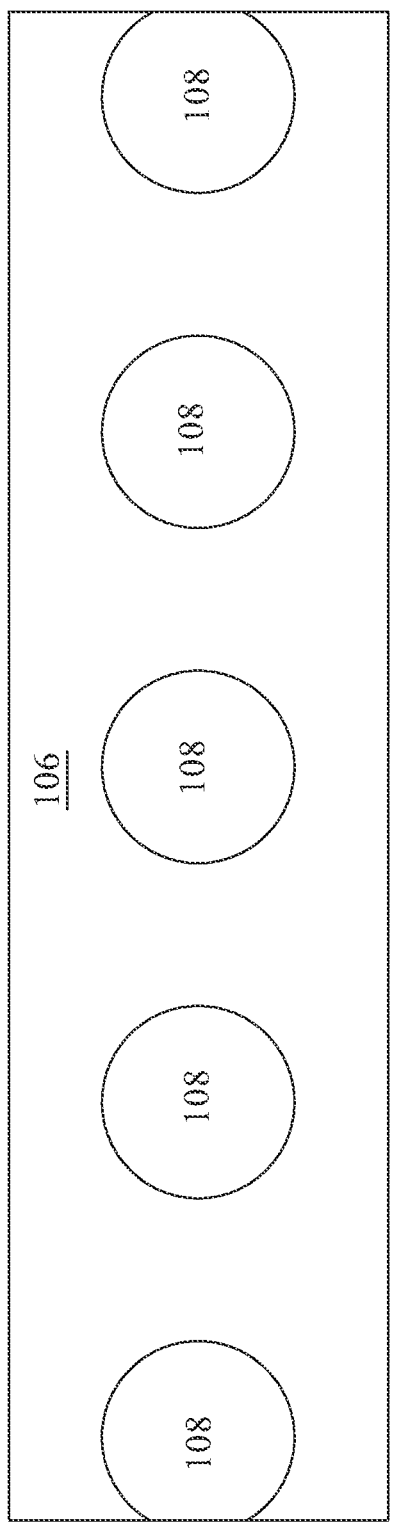

Referring to FIGS. 14 and 15, a trench 108 extending through the first supporting layer 102, the first molding layer 103, the second supporting layer 104 and the second molding layer 105 is formed according to step S307 in FIG. 5. In some embodiments, the trench 108 extends through the third supporting layer 106. FIG. 15 is a top view of FIG. 14. In some embodiments, the first opening 104a is formed prior to the formation of the trench 108. In some embodiments, the trench 108 is formed by removing portions of the first supporting layer 102, the first molding layer 103, the second supporting layer 104 and the second molding layer 105.

In some embodiments, the portions of the first supporting layer 102, the first molding layer 103, the second supporting layer 104 and the second molding layer 105 are removed at one time or sequentially. In some embodiments, the portions of the first supporting layer 102, the first molding layer 103, the second supporting layer 104 and the second molding layer 105 are removed by etching or any other suitable process. In some embodiments, the semiconductor substrate 101 is at least partially exposed through the trench 108.

Figure 16:
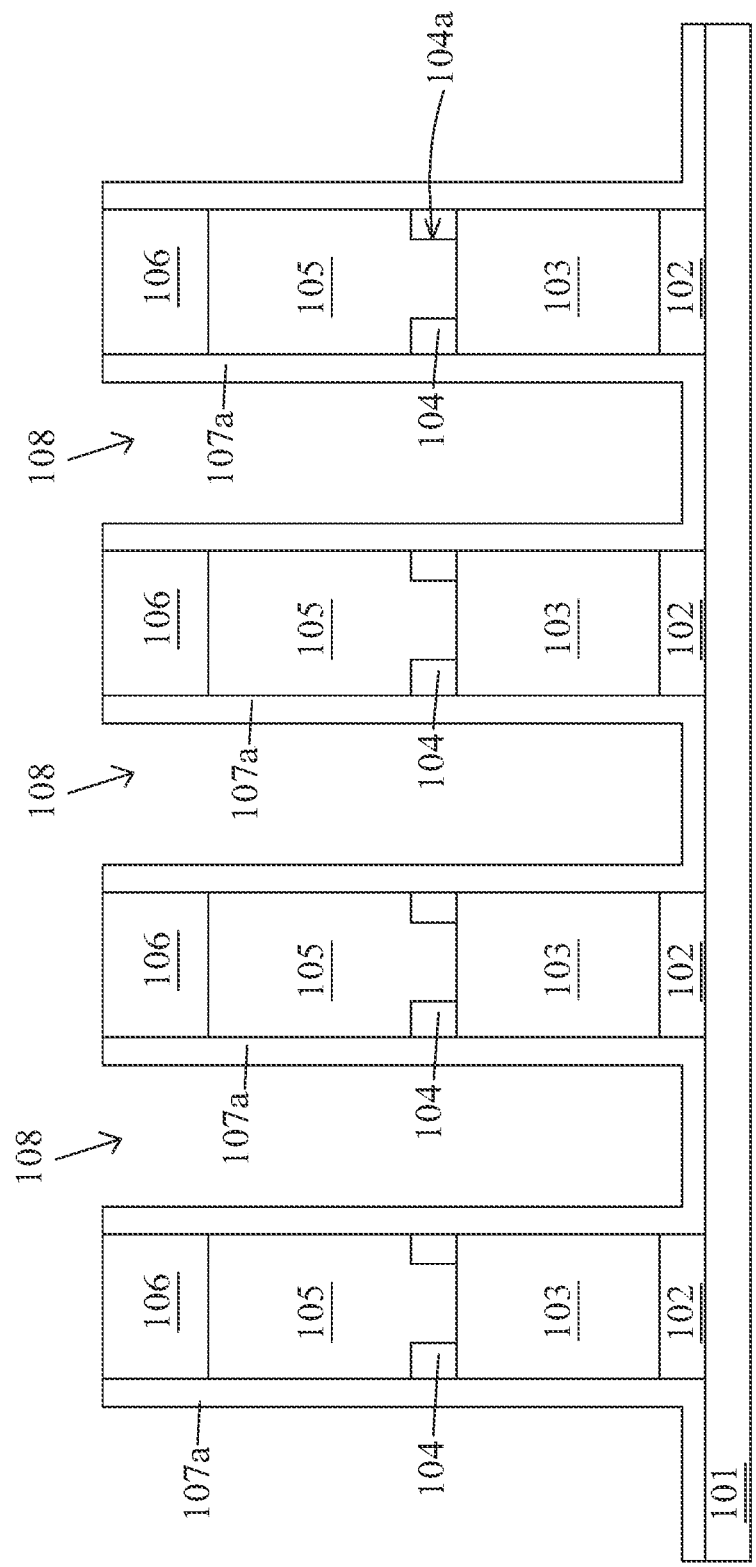
Figure 17:
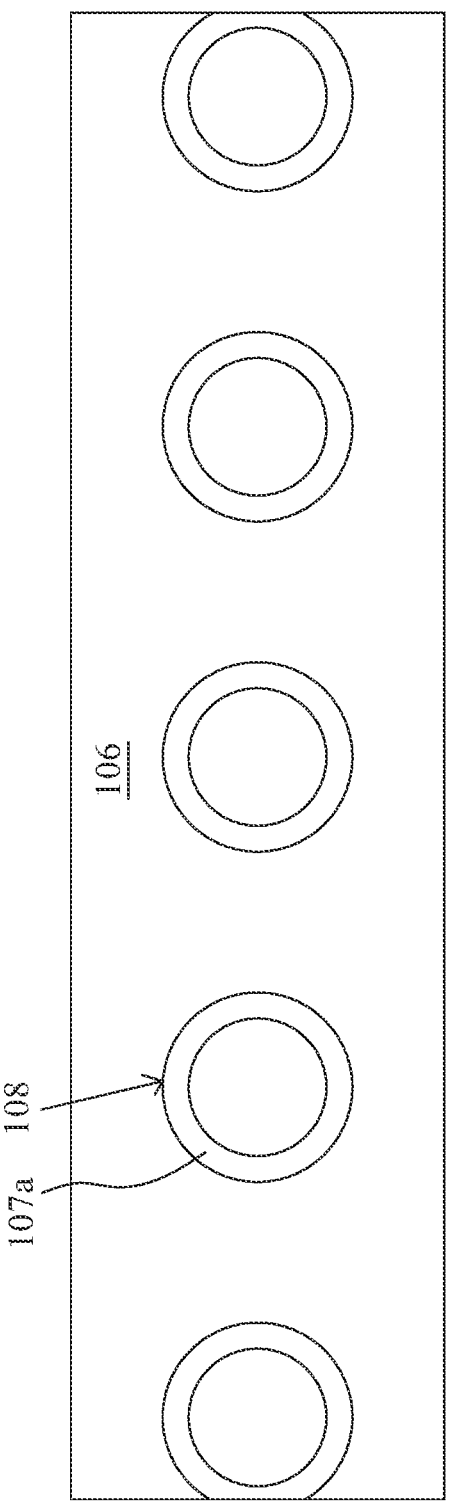

Referring to FIGS. 16 and 17, a conductive layer 107a is disposed conformal to the trench 108 according to step S308 in FIG. 5. FIG. 17 is a top view of FIG. 16. In some embodiments, the conductive layer 107a includes conductive material such as titanium nitride (TiN) or titanium silicon nitride (TiSiN). In some embodiments, the conductive layer 107a is disposed by deposition or any other suitable process. In some embodiments, the conductive layer 107a is disposed conformal to sidewalls of the first supporting layer 102, the first molding layer 103, the second supporting layer 104, the second molding layer 105 and the third supporting layer 106. In some embodiments, the conductive layer 107a is at least partially disposed on the semiconductor substrate 101. In some embodiments, a top surface of the third supporting layer 106 is exposed through the conductive layer 107a. In some embodiments, the top surface of the third supporting layer 106 is substantially coplanar with a top surface of the conductive layer 107a.

In some embodiments, the first opening 104a is formed prior to the disposing of the conductive layer 107a. In some embodiments, the conductive layer 107a is surrounded by the first supporting layer 102, the second supporting layer 104 and the third supporting layer 106. In some embodiments, the conductive layer 107a is surrounded by the first molding layer 103 and the second molding layer 105.

Figure 18:
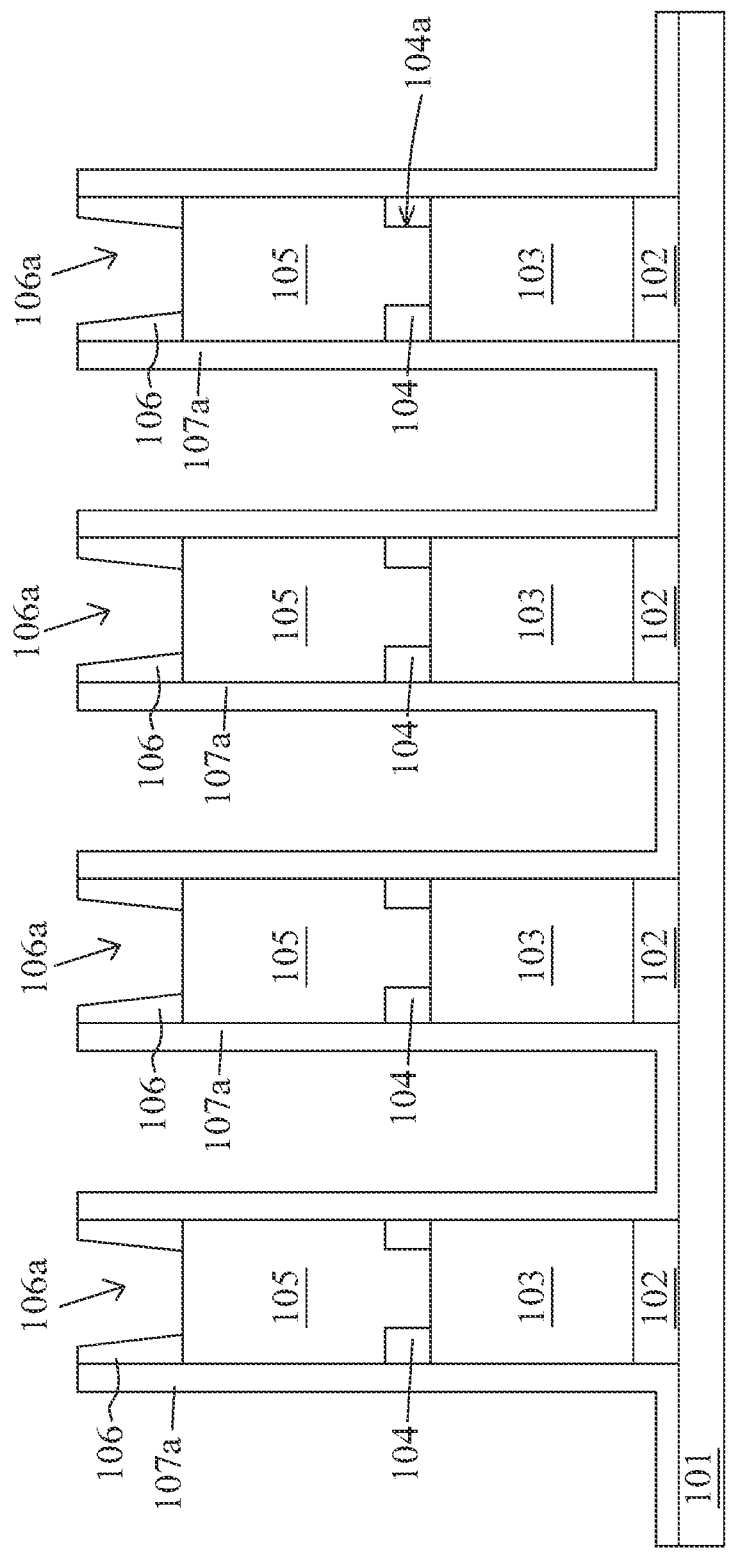
Figure 19:
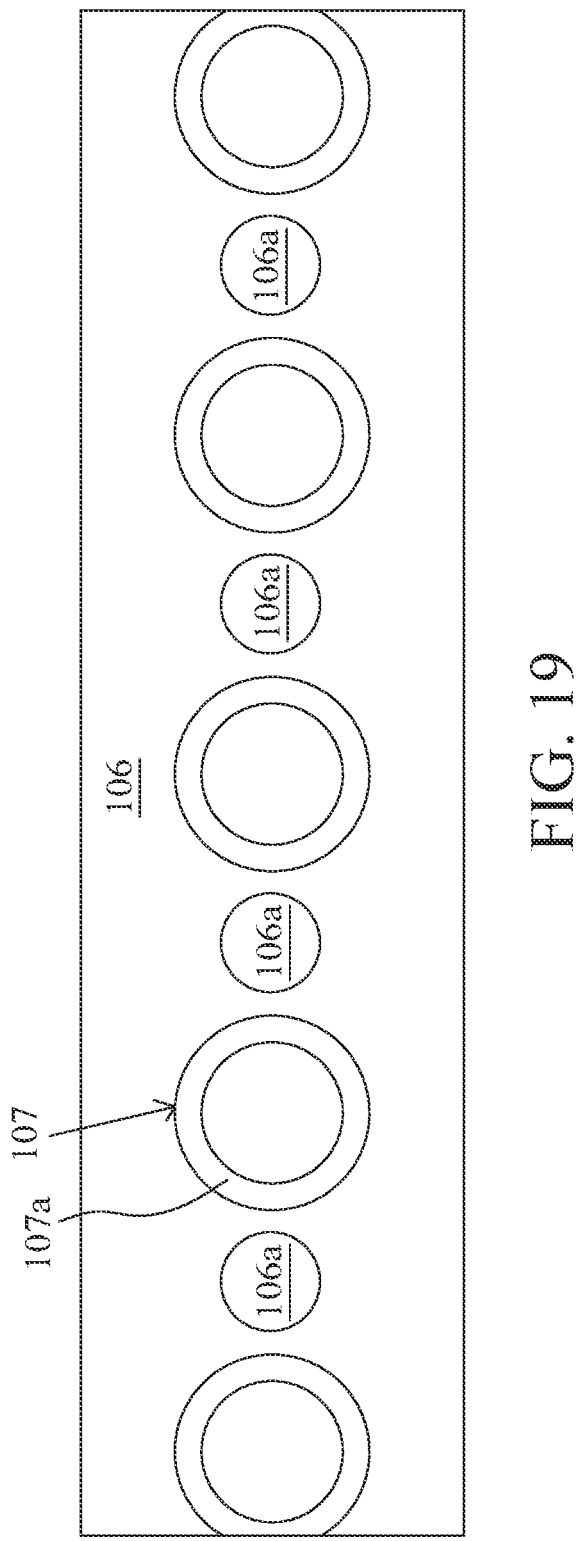

In some embodiments, a portion of the third supporting layer 106 is removed to form a second opening 106a and at least partially expose the second molding layer 105 as shown in FIGS. 18 and 19. FIG. 19 is a top view of FIG. 18. In some embodiments, the portion of the third supporting layer 106 is removed by etching, dry etching or any other suitable process.

In some embodiments, the first opening 104a is formed prior to the removal of the portion of the third supporting layer 106. In some embodiments, the second opening 106a is configured to allow an etchant to flow therethrough. In some embodiments, the second opening 106a is disposed above the first opening 104a. In some embodiments, the second opening 106a is tapered toward the second supporting layer 104 and the first supporting layer 102.

Figure 20:
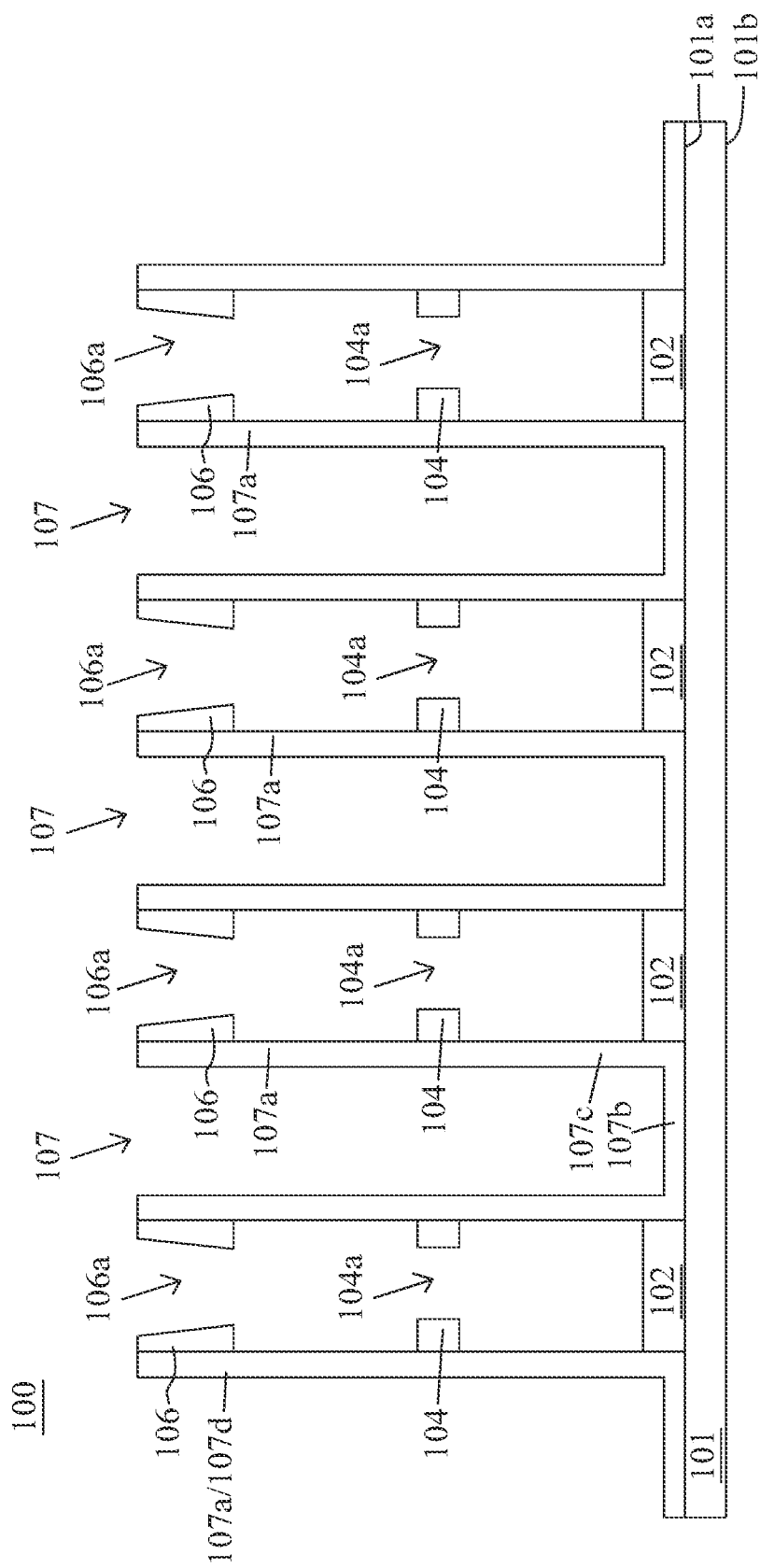

Referring to FIG. 20, the first molding layer 103 and the second molding layer 105 are removed according to step S309 in FIG. 5. In some embodiments, the first molding layer 103 and the second molding layer 105 are removed by etching, wet etching or any other suitable process. In some embodiments, the removal includes flowing an etchant from the second opening 106a to the first opening 104a. In some embodiments, during the etching, the etchant is flowed through the second opening 106a to remove the second molding layer 105, and then the etchant is flowed through the first opening 104a to remove the first molding layer 103. In some embodiments, the etchant is a wet etchant such as hydrofluoric acid or the like.

In some embodiments, the first opening 104a is formed prior to the removal of the first molding layer 103. In some embodiments, the removal of the first molding layer 103 is performed immediately after the removal of the second molding layer 105. In some embodiments, the removal of the first molding layer 103 and the second molding layer 105 is performed immediately after the removal of the portion of the third supporting layer 106. In some embodiments, the first supporting layer 102 and the second supporting layer 104 surround the conductive layer 107a after the removal of the first molding layer 103 and the second molding layer 105.

In some embodiments, the conductive layer 107a is an electrode 107d of the capacitor 107 or is a part of the electrode 107d of the capacitor 107. In some embodiments, the conductive layer 107a is a bottom electrode of the capacitor 107. In some embodiments, the electrode 107d of the capacitor 107 is electrically connected to the landing pad. In some embodiments, a first memory device 100 as shown in FIG. 1 is formed.

Because the second supporting layer 104 has the first opening 104a configured to allow the etchant to flow therethrough before the removal of the second molding layer 105, the removal of the first molding layer 103 can be performed immediately after the removal of the second molding layer 105. As such, unintentional reduction of the conductive layer 107a during the formation of the first opening 104a can be prevented or minimized. Therefore, a strength of an overall structure of the capacitor 107 can be enhanced.

Figure 21:
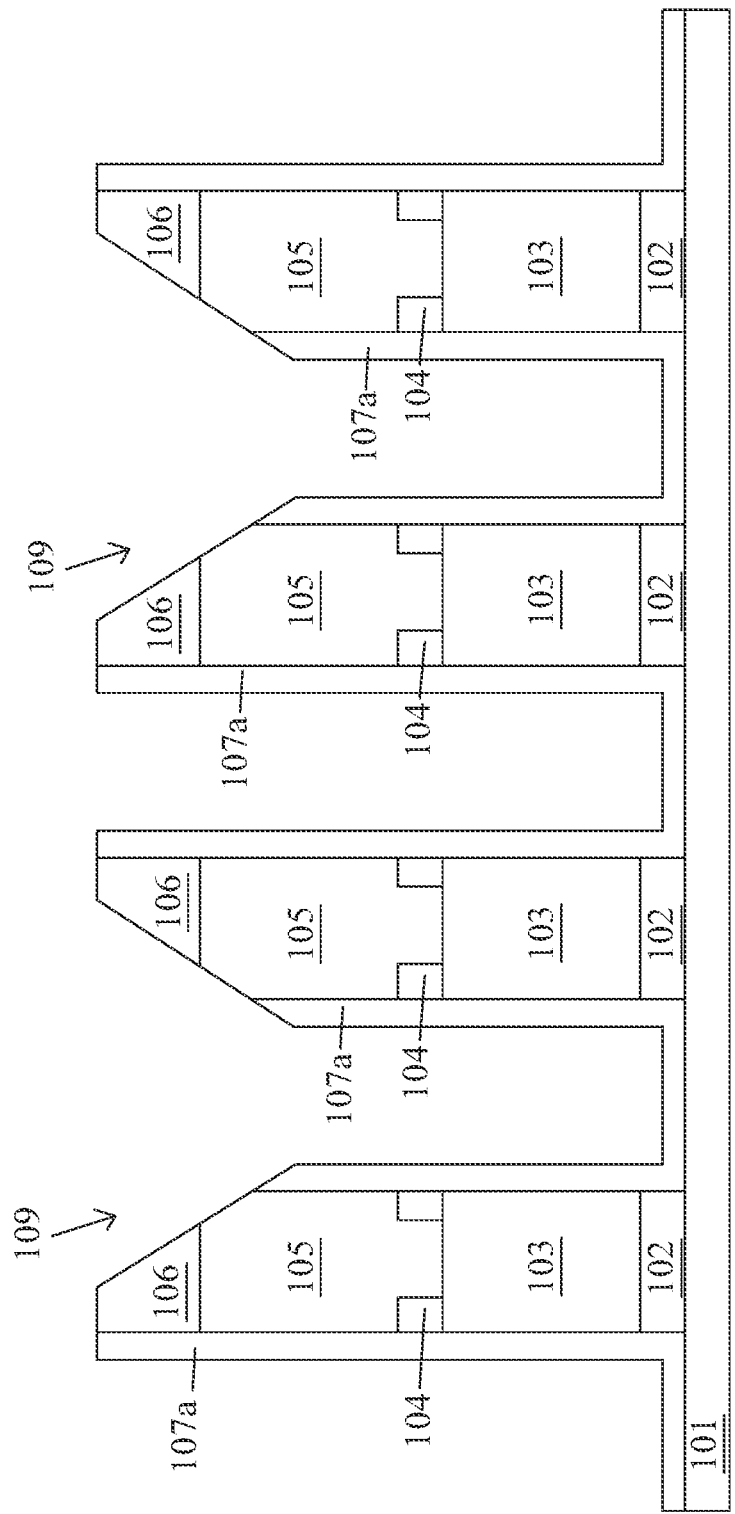
Figure 22:
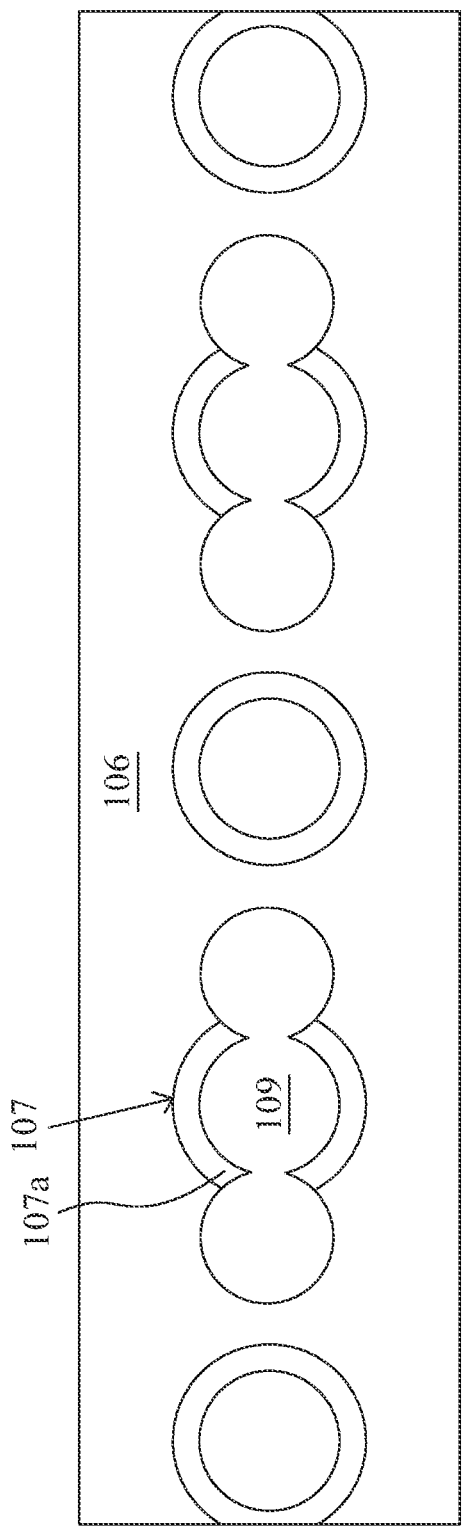

In some embodiments, the second memory device 200 of FIG. 2 can be formed by the following steps after the disposing of the conductive layer 107a as shown in FIG. 16. After the disposing of the conductive layer 107a as shown in FIG. 16, a third opening 109 is formed as shown in FIGS. 21 and 22. In some embodiments, portions of the third supporting layer 106, the second molding layer 105 and the conductive layer 107a are removed to form the third opening 109. In some embodiments, the portions of the third supporting layer 106, the second molding layer 105 and the conductive layer 107a are removed by etching or any other suitable process. In some embodiments, the third opening 109 is configured to allow an etchant to flow therethrough.

Figure 23:
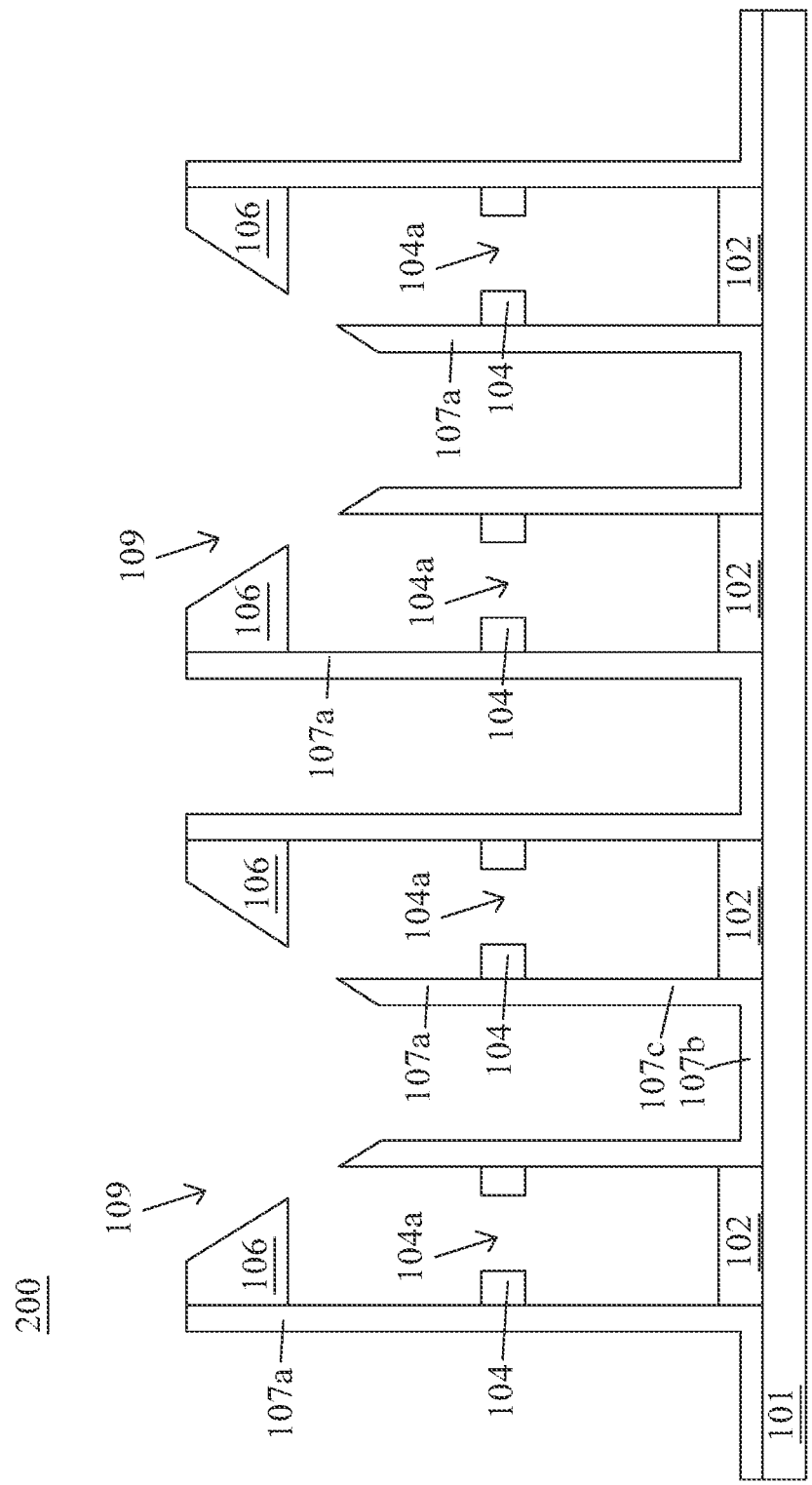

In some embodiments, after the formation of the third opening 109, the first molding layer 103 and the second molding layer 105 are removed as shown in FIG. 23, in a manner similar to that of the step S309 described above. In some embodiments, the second memory device 200 as shown in FIG. 3 is formed.

In an aspect of the present disclosure, a memory device is provided. The memory device includes a semiconductor substrate; a capacitor protruding from the semiconductor substrate; a first supporting layer disposed on the semiconductor substrate and surrounding the capacitor; and a second supporting layer disposed above the first supporting layer and surrounding the capacitor, wherein the second supporting layer includes a first opening extending through the second supporting layer and disposed adjacent to the capacitor.

In another aspect of the present disclosure, a method of manufacturing a memory device is provided. The method includes steps of providing a semiconductor substrate; disposing a first supporting layer over the semiconductor substrate; disposing a first molding layer over the first supporting layer; disposing a second supporting layer over the first molding layer; removing a portion of the second supporting layer to form a first opening; disposing a second molding layer over the second supporting layer and within the first opening; forming a trench extending through the first supporting layer, the first molding layer, the second supporting layer and the second molding layer; disposing a conductive layer conformal to the trench; and removing the first molding layer and the second molding layer.

In another aspect of the present disclosure, a method of manufacturing a memory device is provided. The method includes step of providing a semiconductor substrate; disposing a first supporting layer over the semiconductor substrate; disposing a first molding layer over the first supporting layer; disposing a second supporting layer over the first molding layer; forming a first opening through the second supporting layer to at least partially expose the first molding layer; disposing a second molding layer over the second supporting layer and within the first opening; disposing a third supporting layer over the second molding layer; forming a trench extending through the first supporting layer, the first molding layer, the second supporting layer, the second molding layer and the third supporting layer; disposing a conductive layer conformal to the trench; removing a portion of the third supporting layer to form a second opening and at least partially expose the second molding layer; and removing the first molding layer and the second molding layer.

In conclusion, because an opening is formed in an intermediate supporting layer prior to disposing of a molding layer over the intermediate supporting layer, a subsequent etching of the molding layer can be implemented at one time. As such, unintentional reduction of a conductive layer of a capacitor during the etching of the molding layer can be prevented or minimized. Therefore, a strength of an overall structure of the capacitor can be enhanced. An overall performance of a memory device and process of manufacturing the memory device are improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a memory device, comprising:
   providing a semiconductor substrate;
   disposing a first supporting layer over the semiconductor substrate;
   disposing a first molding layer over the first supporting layer;
   disposing a second supporting layer over the first molding layer;
   removing a portion of the second supporting layer to form a first opening;
   disposing a second molding layer over the second supporting layer and within the first opening;
   forming a trench extending through the first supporting layer, the first molding layer, the second supporting layer and the second molding layer;
   disposing a conductive layer conformal to the trench; and
   removing the first molding layer and the second molding layer, wherein a portion of the conductive layer is removed during the removal of the first molding layer and the second molding layer.

2. The method according to claim 1, wherein the first molding layer is at least partially in contact with the second molding layer through the first opening.

3. The method according to claim 1, wherein the first opening extends between the first molding layer and the second molding layer.

4. The method according to claim 1, wherein the first opening is formed prior to the removal of the first molding layer.

5. The method according to claim 1, wherein the first molding layer and the second molding layer are removed by a wet etching process.

6. The method according to claim 1, wherein the first opening is formed prior to the disposing of the second molding layer.

7. The method according to claim 1, wherein the first molding layer and the second molding layer include oxide.

8. The method according to claim 1, wherein the portion of the second supporting layer is removed by a dry etching process.

9. The method according to claim 1, wherein the first opening is formed prior to the disposing of the conductive layer.

10. The method according to claim 1, wherein the conductive layer is at least partially disposed on the semiconductor substrate.

11. The method according to claim 1, wherein the removal of the first molding layer is performed immediately after the removal of the second molding layer.

12. The method according to claim 1, wherein the first molding layer is at least partially exposed through the second supporting layer after the first opening is formed.

13. The method according to claim 1, wherein the first supporting layer and the second supporting layer surround the conductive layer after the removal of the first molding layer and the second molding layer.

14. A method of manufacturing a memory device, comprising:
- providing a semiconductor substrate;
- disposing a first supporting layer over the semiconductor substrate;
- disposing a first molding layer over the first supporting layer;
- disposing a second supporting layer over the first molding layer;
- forming a first opening through the second supporting layer to at least partially expose the first molding layer;
- disposing a second molding layer over the second supporting layer and within the first opening;
- disposing a third supporting layer over the second molding layer;
- forming a trench extending through the first supporting layer, the first molding layer, the second supporting layer, the second molding layer and the third supporting layer;
- disposing a conductive layer conformal to the trench;
- removing a portion of the third supporting layer to form a second opening and at least partially expose the second molding layer; and
- removing the first molding layer and the second molding layer, wherein the removal of the first molding layer and the second molding layer is performed immediately after the removal of the portion of the third supporting layer.

15. The method according to claim 14, wherein the first opening is formed prior to the removal of the portion of the third supporting layer.

16. The method according to claim 14, wherein the portion of the third supporting layer is removed by a dry etching process.

17. The method according to claim 14, wherein a portion of the conductive layer is removed during the removal of the portion of the third supporting layer.

18. The method according to claim 14, wherein the first opening is formed prior to the disposing of the third supporting layer.

* * * * *